US012665039B2

(12) United States Patent
Choi et al.

(10) Patent No.: US 12,665,039 B2
(45) Date of Patent: Jun. 23, 2026

(54) SEMICONDUCTOR DEVICE AND SIMULTANEOUS BLOCK OPERATIONS METHOD USING MULTIPLE SOURCE LINES

(71) Applicant: SK hynix Inc., Gyeonggi-do (KR)

(72) Inventors: Won Jae Choi, Gyeonggi-do (KR); Sung Lae Oh, Gyeonggi-do (KR); Jea Won Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 127 days.

(21) Appl. No.: 18/596,651

(22) Filed: Mar. 6, 2024

(65) Prior Publication Data

US 2025/0182832 A1 Jun. 5, 2025

(30) Foreign Application Priority Data

Nov. 30, 2023 (KR) ........................ 10-2023-0170321

(51) Int. Cl.
| | |
|---|---|
| *G11C 16/34* | (2006.01) |
| *G11C 16/04* | (2006.01) |
| *G11C 16/08* | (2006.01) |
| *G11C 16/14* | (2006.01) |
| *G11C 16/16* | (2006.01) |
| *G11C 16/24* | (2006.01) |

(52) U.S. Cl.
CPC ...... *G11C 16/3445* (2013.01); *G11C 16/0433* (2013.01); *G11C 16/0483* (2013.01); *G11C 16/08* (2013.01); *G11C 16/14* (2013.01); *G11C 16/16* (2013.01); *G11C 16/24* (2013.01); *G11C 16/3459* (2013.01); *G11C 2216/22* (2013.01); *G11C 2216/24* (2013.01)

(58) Field of Classification Search
CPC ............ G11C 16/3445; G11C 16/0433; G11C 16/0483; G11C 16/08; G11C 16/14; G11C 16/16; G11C 16/24; G11C 16/3459; G11C 2216/22; G11C 2216/24; G11C 16/10; G11C 16/26; G11C 16/32
See application file for complete search history.

(56) References Cited

U.S. PATENT DOCUMENTS

| | | | |
|---|---|---|---|
| 11,189,335 B2 | 11/2021 | Nishikawa et al. | |
| 2002/0141250 A1 | 10/2002 | Tedrow et al. | |
| 2015/0078086 A1* | 3/2015 | Lee .................... | G11C 16/0483 |
| | | | 365/185.11 |
| 2020/0219572 A1* | 7/2020 | Harari ................. | G11C 11/5628 |
| 2020/0402587 A1* | 12/2020 | Chibvongodze .... | G11C 11/5635 |
| 2022/0129197 A1 | 4/2022 | Choi et al. | |
| 2022/0130464 A1 | 4/2022 | Choi et al. | |
| 2023/0027837 A1* | 1/2023 | Petti ....................... | H10B 51/10 |
| 2023/0380138 A1* | 11/2023 | Sakui ................. | G11C 11/4091 |
| 2025/0046387 A1* | 2/2025 | Wang .................... | G11C 16/10 |

FOREIGN PATENT DOCUMENTS

KR 10-2022-0055302 A 5/2022

\* cited by examiner

*Primary Examiner* — Donald HB Braswell
(74) *Attorney, Agent, or Firm* — IP & T GROUP LLP

(57) ABSTRACT

A semiconductor device may include a first source line driving circuit that drives a first source line, a second source line driving circuit that drives a second source line, a first memory block including a plurality of first memory strings coupled between the first source line and a plurality of bit lines, respectively, and a second memory block including a plurality of second memory strings coupled between the second source line and the plurality of bit lines, respectively.

20 Claims, 7 Drawing Sheets

SEMICONDUCTOR DEVICE AND SIMULTANEOUS BLOCK OPERATIONS METHOD USING MULTIPLE SOURCE LINES

CROSS-REFERENCE TO RELATED APPLICATION

This application claims priority under 35 U.S.C. § 119 (a) to Korean Patent Application No. 10-2023-0170321 filed on Nov. 30, 2023, which is incorporated herein by reference in its entirety.

BACKGROUND

1. Technical Field

Embodiments of the present disclosure relate to a semiconductor integrated circuit, and more particularly, to a semiconductor device and an operation method using the same.

2. Related Art

Recently, with the miniaturization, low power consumption, high performance, and diversification of electronic devices, there is a demand for semiconductor devices capable of storing information in various electronic devices such as computers and portable communication devices. The semiconductor devices may be roughly classified into volatile memory devices and nonvolatile memory devices. The volatile memory device has a high data processing speed, but has a disadvantage in that power needs to be continuously supplied in order to retain stored data, while the nonvolatile memory device does not need to be continuously supplied with power in order to retain stored data, but has a disadvantage in that a data processing speed is low.

The nonvolatile memory device performs a program operation to store data therein and performs an erase operation to erase the stored data. The nonvolatile memory device performs an operation of verifying whether data has been normally programmed or erased during a program operation or an erase operation.

Accordingly, to improve the data processing speed of the nonvolatile memory device, research is being conducted to reduce the time required for a program or erase operation as well as the time required for verifying each operation.

SUMMARY

A semiconductor device in accordance with an embodiment of the present disclosure may include: a first source line driving circuit that drives a first source line; a second source line driving circuit that drives a second source line; a first memory block including a plurality of first memory strings coupled between the first source line and a plurality of bit lines, respectively; and a second memory block including a plurality of second memory strings coupled between the second source line and the plurality of bit lines, respectively.

An operation method of a semiconductor device in accordance with an embodiment of the present disclosure may include: driving a first source line to a level of an erase voltage; driving a second source line to a level of a ground voltage or a power supply voltage; performing an erase operation on a first memory block coupled to the first source line; and performing a read operation or a program operation on a second memory block coupled to the second source line.

DETAILED DESCRIPTION

Various embodiments of the present disclosure are directed to providing a semiconductor device in which, when some of memory blocks sharing a page buffer are performing a specific operation, at least one other memory block may perform an operation different from the specific operation.

Embodiments of the present disclosure may improve the operation speed of a memory device because each memory block may perform mutually different operations.

Hereafter, embodiments in accordance with the technical spirit of the present disclosure are described with reference to the accompanying drawings.

Figure 1:
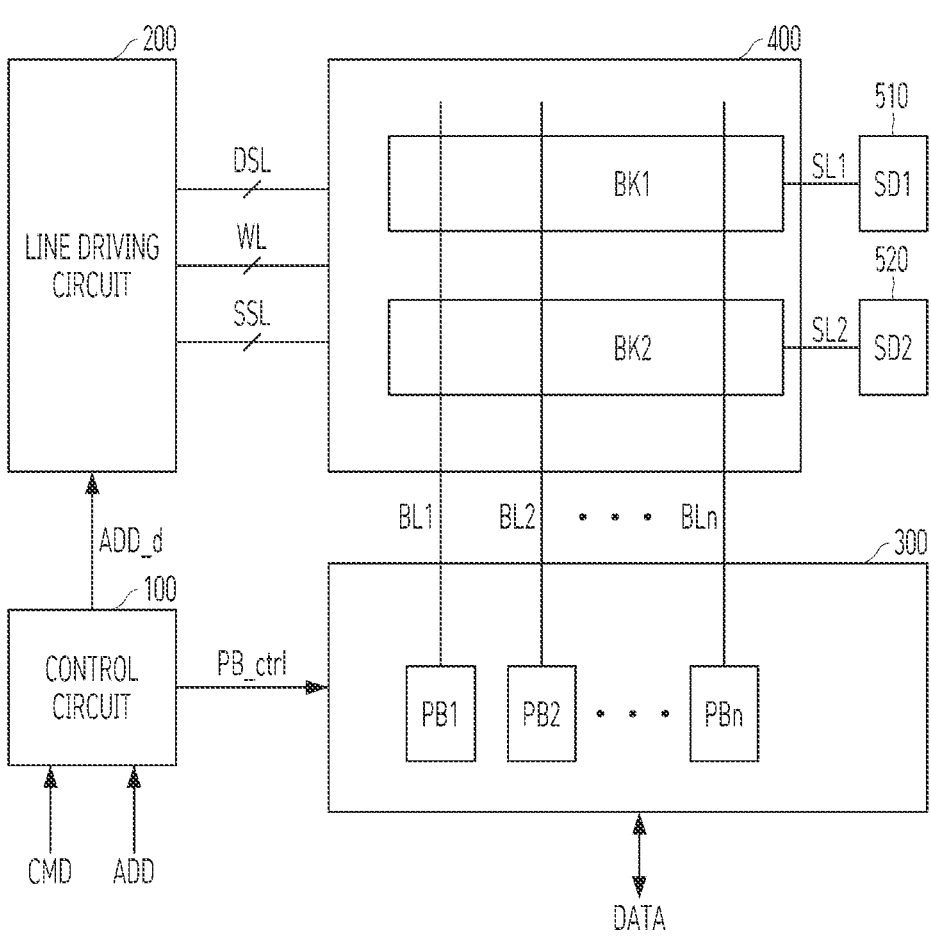
FIG. 1 is a diagram for describing a semiconductor device in accordance with an embodiment of the present disclosure.

FIG. 1 is a diagram illustrating a semiconductor device in accordance with an embodiment of the present disclosure.

Referring to FIG. 1, the semiconductor device in accordance with an embodiment of the present disclosure may include a control circuit 100, a line driving circuit 200, a page buffer group 300, a cell array 400, a first source line driving circuit (SD1) 510, and a second source line driving circuit (SD2) 520.

The control circuit 100 may control the line driving circuit 200 and the page buffer group 300. For example, the control circuit 100 may control the line driving circuit 200 and the page buffer group 300 based on a command signal CMD and an address signal ADD. The control circuit 100 may generate a driving address signal ADD_d based on the command signal CMD and the address signal ADD. The control circuit 100 may control the line driving circuit 200 by providing the driving address signal ADD_d to the line driving circuit 200. The control circuit 100 may further generate a page buffer control signal PB_ctrl based on the command signal CMD and the address signal ADD. The control circuit 100 may control the page buffer group 300 by providing the page buffer control signal PB_ctrl to the page buffer group 300.

The line driving circuit 200 may receive the driving address signal ADD_d from the control circuit 100. The line driving circuit 200 may drive each of drain select lines DSL, word lines WL, and source select lines SSL to at least one voltage level among the levels of a plurality of voltages based on the driving address signal ADD_d. For example, the plurality of voltages may be voltages provided from the inside or outside of the semiconductor device, and the plurality of voltages may have different voltage levels. The plurality of voltages may include a pass voltage, a read voltage, and a program voltage having mutually different voltage levels.

The page buffer group 300 may include a plurality of page buffers PB1 to PBn. The plurality of page buffers PB1 to PBn may be connected to the plurality of bit lines BL1 to BLn, respectively. During a read operation, each of the plurality of page buffers PB1 to PBn may sense a value of data stored in a memory cell of the cell array 400 through a bit line under the control of the page buffer control signal PB_ctrl, and output the sensed value as data DATA. During a verification operation, each of the plurality of page buffers PB1 to PBn may output a threshold voltage of the memory cell sensed through the bit line as a verification result under the control of the page buffer control signal PB_ctrl. During a program operation, each of the plurality of page buffers PB1 to PBn may adjust a voltage level of the bit line under the control of the page buffer control signal PB_ctrl. The cell array 400 may include a plurality of memory blocks.

For example, the plurality of memory blocks may include first and second memory blocks BK1 and BK2. Each of the first and second memory blocks BK1 and BK2 may be selected by the word lines WL. Memory strings of one memory block selected from the first and second memory blocks BK1 and BK2 may be connected to the plurality of page buffers PB1 to PBn through the plurality of bit lines BL1 to BLn. Each of the first and second memory blocks BK1 and BK2 may include a plurality of memory strings in which a plurality of memory cells are connected in series. Each of the plurality of memory strings may include first and second select transistors (for example, a drain select transistor and a source select transistor) in addition to the plurality of memory cells connected in series. The first select transistor may be configured to be turned on or off by the drain select line DSL, and the second select transistor may be configured to be turned on or off by the source select line SSL. The plurality of memory strings included in the first memory block BK1 may be connected between the first source line SL1 and the plurality of bit lines BL1 to BLn. The plurality of memory strings included in the second memory block BK2 may be connected between the second source line SL2 and the plurality of bit lines BL1 to BLn.

The first source line driving circuit 510 may drive the first source line SL1. For example, the first source line driving circuit 510 may drive the first source line SL1 to a first voltage level during a read operation or a program operation. During an erase operation, the first source line driving circuit 510 may drive the first source line SL1 to a second voltage level.

The second source line driving circuit 520 may drive the second source line SL2. For example, the second source line driving circuit 520 may drive the second source line SL2 to the first voltage level during a read operation or a program operation. During an erase operation, the second source line driving circuit 520 may drive the second source line SL2 to the second voltage level. In such a case, the first voltage level may be a ground voltage level, and the second voltage level may be an erase voltage having a voltage level greater than the ground voltage level.

In the semiconductor device in accordance with the embodiment of the present disclosure configured described above, when one of the first and second memory blocks BK1 and BK2 performs a read or program operation by using the first or second source line SL1 or SL2 electrically disconnected, the other one of the first and second memory blocks BK1 and BK2 may perform an erase operation. For example, when a first voltage is provided to the first source line SL1 and a second voltage is provided to the second source line SL2, a read or program operation may be performed on selected memory strings of the first memory block BK1 according to the word lines WL, the drain select lines DSL, and the source select lines SSL. While the read or program operation is being performed on the first memory block BK1, an erase operation may be performed on all memory strings of the second memory block BK2.

The semiconductor device in accordance with the embodiment of the present disclosure may include source lines that are electrically disconnected from each other for each memory block sharing a plurality of bit lines and a source line driving circuit that drives each source line, so that when a read or write operation is performed on one memory block among the memory blocks, an erase operation may be performed on at least one other memory block. In the semiconductor device in accordance with an embodiment of the present disclosure, memory blocks share a plurality of bit lines, so that after a read or write operation is performed, an erase verification operation may be performed on at least one memory block subjected to an erase operation.

Figure 2:
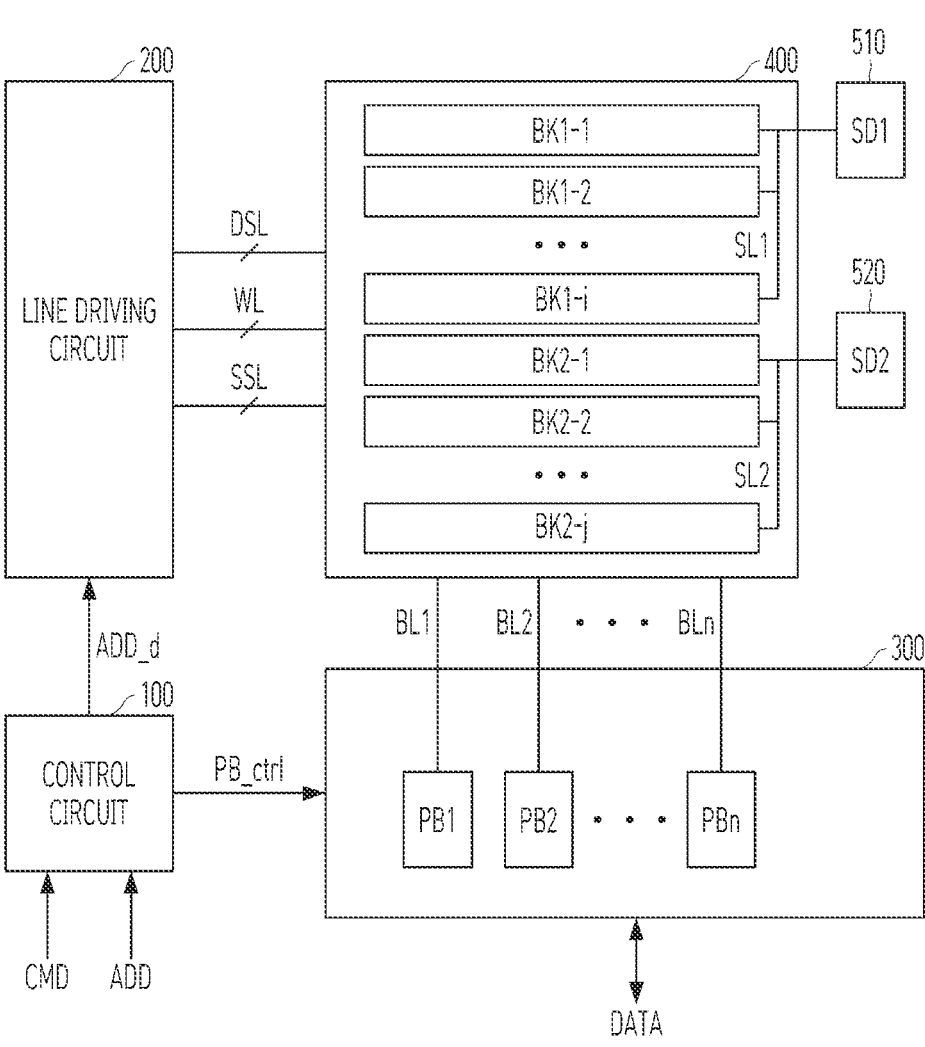
FIG. 2 is a diagram for describing a semiconductor device in accordance with another embodiment of the present disclosure.

FIG. 2 is a diagram for describing a semiconductor device in accordance with another embodiment of the present disclosure. In FIG. 2, because the other configurations except for the cell array 400 in FIG. 2 are the same as the configurations of FIG. 1, only the configuration of the cell array 400 is described below.

Referring to FIG. 2, the cell array 400 may include a plurality of memory blocks. For example, the plurality of memory blocks may include first memory blocks BK1-1 to BK-i and second memory blocks BK2-1 to BK2-j. Each of the first memory blocks BK1-1 to BK-i and the second memory blocks BK2-1 to BK2-j may be selected by the word lines WL. Memory strings of one memory block selected from the first memory blocks BK1-1 to BK-i and the second memory blocks BK2-1 to BK2-j may be connected to the plurality of page buffers PB1 to PBn through a plurality of bit lines BL1 to BLn. Each of the first memory blocks BK1-1 to BK-i and the second memory blocks BK2-1 to BK2-j may further include a plurality of memory strings in which a plurality of memory cells are connected in series. Each of the plurality of memory strings may include first and second select transistors (for example, a drain select transistor and a source select transistor) in addition to the plurality of memory cells connected in series. The first select transistor may be configured to be turned on or off by the drain select line DSL, and the second select transistor may be configured to be turned on or off by the source select line SSL. The plurality of memory strings included in the first memory block BK1 may be connected between the first source line SL1 and the plurality of bit lines BL1 to BLn. The plurality of memory strings included in the second memory block BK2 may be connected between the second source line SL2 and the plurality of bit lines BL1 to BLn.

The first memory blocks BK-1 to BK-i may be connected to the first source line SL1 driven by the first source line driving circuit (SD1) 510. The second memory blocks BK2-1 to BK2-j may be connected to the second source line SL2 driven by the second source line driving circuit (SD2) 520. Hereinafter, the configuration and operation of the semiconductor device in accordance with an embodiment of the present disclosure are described in detail.

Figure 3:
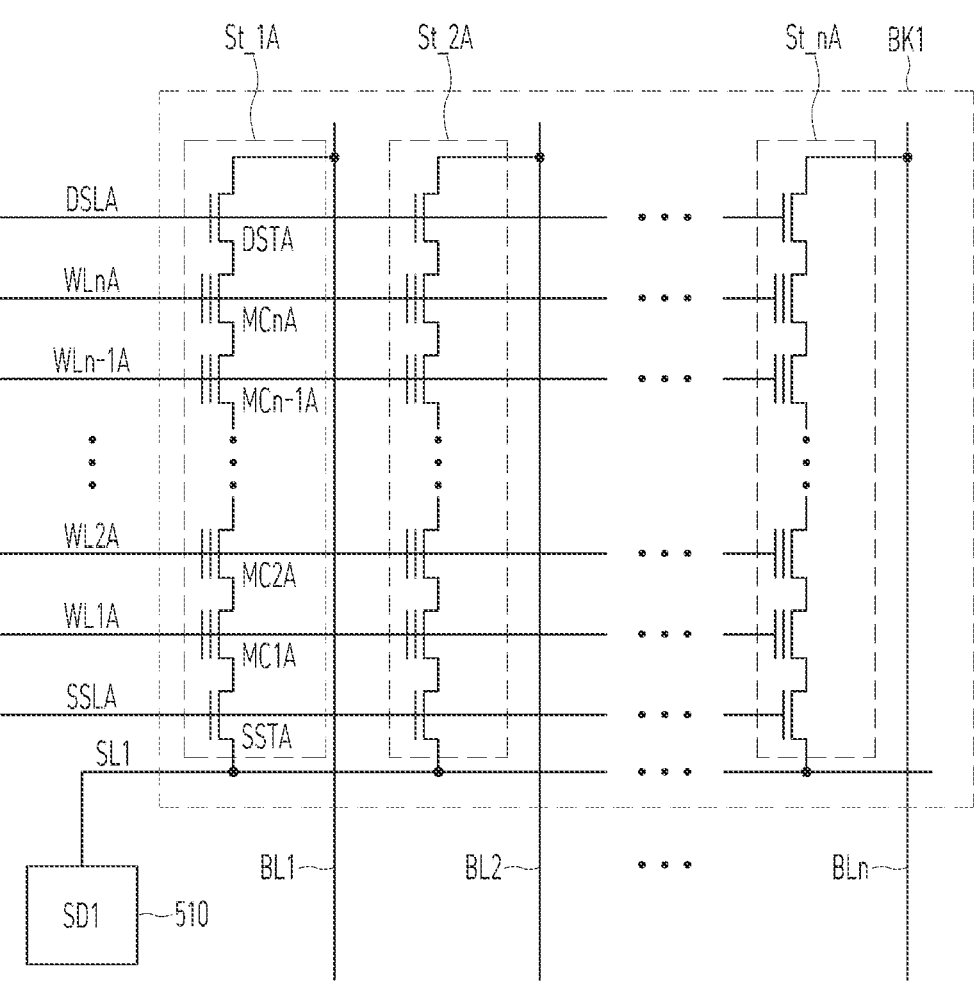
FIGS. 3 and 4 are diagrams for describing a memory block of a semiconductor device having a memory array with NAND strings in accordance with an embodiment of the present disclosure.
Figure 4:
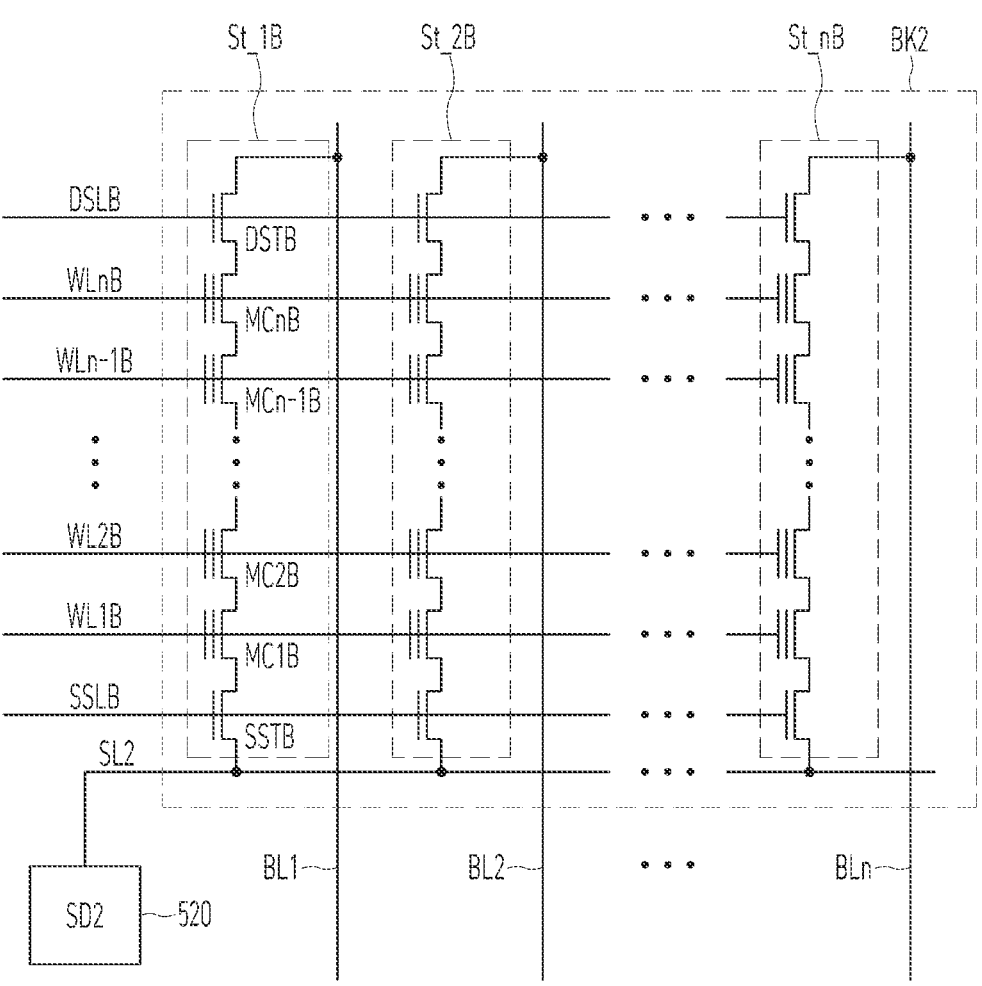

FIGS. 3 and 4 are diagrams for describing a memory block of the semiconductor device having a memory array with NAND strings in accordance with an embodiment of the present disclosure. The drain select lines DSL may include at least one first drain select line DSLA (FIG. 3) and at least one second drain select line DSLB (FIG. 4). The word lines WL may include a plurality of first word lines WL1A to WLnA (FIG. 3) and a plurality of second word lines WL1B to WLnB (FIG. 4). The source select lines SSL may include at least one first source select line SSLA (FIG. 3) and at least one second source select line SSLB (FIG. 4).

First, the first memory block BK1 is described with reference to FIG. 3 as follows.

The first memory block BK1 may include a plurality of first memory strings St_1A to St_nA connected between the plurality of bit lines BL1 to BLn and the first source line SL1. The plurality of bit lines BL1 to BLn may include first to $n^{th}$ bit lines BL1 to BLn. For example, the first memory string St_1A may be connected between the first bit line BL1 and the first source line SL1. The first memory string St_2A may be connected between the second bit line BL2 and the first source line SL1. The first memory string St_nA may be connected between the $n^{th}$ bit line BLn and the first source line SL1.

Each of the plurality of first memory strings St_1A to St_nA may include a first drain select transistor DSTA, a plurality of first memory cells MC1A to MCnA, and a first source select transistor SSTA that are connected in series. The first drain select transistor DSTA may be configured to be controlled by the first drain select line DSLA, and the first source select transistor SSTA may be configured to be controlled by the first source select line SSLA. The plurality of first memory cells MC1A to MCnA may be configured to be controlled by the plurality of first word lines WL1A to WLnA, respectively.

The operation of the first memory block BK1 of the semiconductor device in accordance with an embodiment of the present disclosure configured described above is described as follows.

During a program operation, the first source line SL1 may be driven to an external power supply voltage level by the first source line driving circuit (SD1) 510. A ground voltage may be provided to at least one bit line selected from the first to $n^{th}$ bit lines BL1 to BLn, and an external power supply voltage may be provided to an unselected bit line. A program voltage may be provided to a word line selected from the plurality of first word lines WL1A to WLnA, and a pass voltage may be provided to the remaining unselected word lines. The first drain select transistor DSTA may be turned on, and the first source select transistor SSTA may be turned off.

In such a case, among memory cells of a memory string connected to the selected bit line, that is, a bit line that receives a voltage having a greater level than the ground voltage, memory cells that receive the program voltage through the selected word line may be programmed.

The semiconductor device is described in more detail using an example.

During a program operation, the first bit line BL1 is selected from the first to $n^{th}$ bit lines BL1 to BLn and the first first-word line WL1A is selected from the plurality of first word lines WL1A to WLnA.

In such a case, the first first-memory cell MC1A connected to the first first-word line WL1A among the first memory cells MC1A to MCnA of the first first-memory string St_1A connected to the selected bit line, that is, the first bit line BL1 receiving the ground voltage, may be programmed.

During a read operation, the first source line SL1 may be driven to a ground voltage level by the first source line driving circuit 510. A voltage greater than the ground voltage may be provided to at least one bit line selected from the first to nth bit lines BL1 to BLn. A read voltage may be provided to a word line selected from the plurality of first word lines WL1A to WLnA, and a pass voltage may be provided to the remaining unselected word lines. The first drain select transistor DSTA and the first source select transistor SSTA may be turned on so that current may flow through a memory string connected to the selected bit line.

At least one memory string connected to at least one bit line selected from the plurality of first memory strings St_1A to St_nA may allow current to flow from the bit line to the first source line SL1. In such a case, the amount of the current flowing from the bit line to the first source line SL1 may be adjusted according to data stored in a memory cell that receives the read voltage through the selected word line among memory cells included in at least one memory string. In such a case, a page buffer connected to the selected bit line may sense and store the data stored in the memory cell that receives the read voltage by detecting the voltage level of the selected bit line or the amount of current flowing through the bit line. The read operation may be completed by outputting the data stored in the page buffer.

During an erase operation, the first source line SL1 may be driven by the first source line driving circuit 510 to an erase voltage level greater than the ground voltage level. The first drain select transistor DSTA may be turned off, and the first source select transistor SSTA may be turned on. The plurality of first word lines WL1A to WLnA may be provided with the ground voltage. In such a case, the erase operation may be performed on memory cells included in the plurality of first memory strings St_1A to St_nA connected to the first source line SL1.

After the program operation or the erase operation is performed, a verification operation may be performed using the plurality of page buffers PB connected to the first to nth bit lines BL1 to BLn through the first drain select transistor DSTA.

As described above, the first memory block BK1 performs a read operation, a program operation, and a verification operation in a state in which the first drain select transistor DSTA is turned on, so that the plurality of first memory strings St_1A to St_nA included in the first memory block BK1 may be electrically connected to the plurality of bit lines BL1 to BLn during the read operation, the program operation, and the verification operation, respectively.

The first memory block BK1 further performs an erase operation in a state in which the first drain select transistor DSTA is turned off, so that the plurality of first memory strings St_1A to St_nA included in the first memory block BK1 may be electrically disconnected from the plurality of bit lines BL1 to BLn during the erase operation, respectively.

The second memory block BK2 is described below with reference to FIG. 4 as follows.

The second memory block BK2 may include a plurality of second memory strings St_1B to St_nB connected between the plurality of bit lines BL1 to BLn and the second source line SL2. The plurality of bit lines BL1 to BLn may include the first to nth bit lines BL1 to BLn. For example, the second memory string St_1B may be connected between the first bit line BL1 and the second source line SL2. The second memory string St_2B may be connected between the second bit line BL2 and the second source line SL2. The second memory string St_nB may be connected between the $n^{th}$ bit line BLn and the second source line SL2.

Each of the plurality of second memory strings St_1B to St_nB may include a second drain select transistor DSTB, a plurality of second memory cells MC1B to MCnB, and a second source select transistor SSTB that are connected in series. The second drain select transistor DSTB may be configured to be controlled by the second drain select line DSLB, and the second source select transistor SSTB may be configured to be controlled by the second source select line SSLB. The plurality of second memory cells MC1B to MCnB may be configured to be controlled by the plurality of second word lines WL1B to WLnB, respectively.

The operation of the second memory block BK2 of the semiconductor device in accordance with an embodiment of the present disclosure is described as follows.

During a program operation, the second source line SL2 may be driven to an external power supply voltage level by the second source line driving circuit (SD2) 520. A ground voltage may be provided to at least one bit line selected from the first to $n^{th}$ bit lines BL1 to BLn, and an external power supply voltage may be provided to an unselected bit line. A program voltage may be provided to a word line selected from the plurality of second word lines WL1B to WLnB, and a pass voltage may be provided to the remaining unselected word lines. The second drain select transistor DSTB may be turned on and the second source select transistor SSTB may be turned off.

In such a case, among memory cells of a memory string connected to the selected bit line, that is, a bit line that receives the ground voltage, a memory cell that receives the program voltage through the selected word line may be programmed.

During a read operation, the second source line SL2 may be driven to the ground voltage level by the second source line driving circuit 520. A voltage greater than the ground voltage may be provided to at least one bit line selected from the first to $n^{th}$ bit lines BL1 to BLn. A read voltage may be provided to a word line selected from the plurality of second word lines WL1B to WLnB, and a pass voltage may be provided to the remaining unselected word lines. The second drain select transistor DSTB and the second source select transistor SSTB may be turned on so that current may flow through a memory string connected to the selected bit line.

At least one memory string connected to at least one bit line selected from the plurality of second memory strings St_1B to St_nB may allow current to flow from the bit line to the second source line SL2. In such a case, the amount of the current flowing from the bit line to the second source line SL2 may be adjusted according to data stored in a memory cell that receives the read voltage through the selected word line among the memory cells included in at least one memory string. In such a case, a page buffer connected to the selected bit line may sense and store the data stored in the memory cell that receives the read voltage by detecting the voltage level of the selected bit line or the amount of current flowing through the bit line. The read operation may be completed by outputting the data stored in the page buffer.

During an erase operation, the second source line SL2 may be driven by the second source line driving circuit 520 to an erase voltage level greater than the ground voltage level. The second drain select transistor DSTB may be turned off, and the second source select transistor SSTB may be turned on. The plurality of second word lines WL1B to WLnB may be provided with the ground voltage. In such a case, the erase operation may be performed on memory cells included in the plurality of second memory strings St_1B to St_nB connected to the second source line SL2.

After the program operation or the erase operation is performed, a verification operation may be performed using the plurality of page buffers PB connected to the first to $n^{th}$ bit lines BL1 to BLn through the second drain select transistor DSTB.

As described above, the second memory block BK2 performs a read operation, a program operation, and a verification operation in a state in which the second drain select transistor DSTB is turned on, so that the plurality of second memory strings St_1B to St_nB included in the second memory block BK2 may be electrically connected to the plurality of bit lines BL1 to BLn during the read operation, the program operation, and the verification operation, respectively.

The second memory block BK2 performs an erase operation in a state in which the second drain select transistor DSTB is turned off, so that the plurality of second memory strings St_1B to St_nB included in the second memory block BK2 may be electrically disconnected from the plurality of bit lines BL1 to BLn during the erase operation, respectively.

In this way, the semiconductor device in accordance with an embodiment of the present disclosure may include a source line for each of a plurality of memory blocks sharing a plurality of bit lines. Further, the semiconductor device may provide a ground voltage to a source line of a memory block that performs a program operation, a read operation, and a verification operation and may provide an erase voltage having a greater voltage level than the ground voltage to a source line of a memory block that performs an erase operation in a state in which a memory block that performs the program operation, the read operation, and the verification operation is connected to the plurality of bit lines and a memory block that performs the erase operation is electrically disconnected from the plurality of bit lines. Accordingly, the semiconductor device in accordance with an embodiment of the present disclosure may allow some of a plurality of memory blocks to perform the program operation, the read operation, and the verification operation while allowing the other memory blocks to perform the erase operation.

Figure 5:
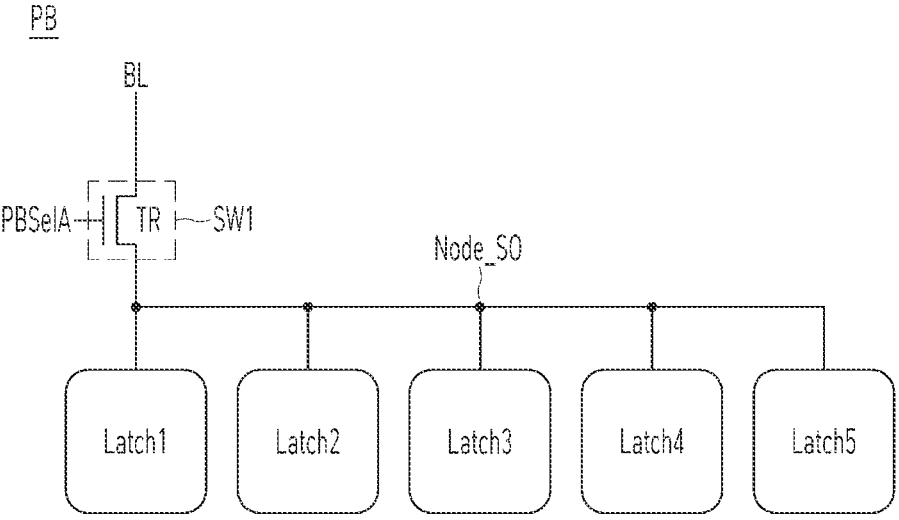
FIG. 5 is a diagram for describing a page buffer of a semiconductor device in accordance with an embodiment of the present disclosure.

FIG. 5 is a diagram for describing a page buffer of the semiconductor device in accordance with an embodiment of the present disclosure.

A page buffer PB of the semiconductor device in accordance with an embodiment of the present disclosure illustrated in FIG. 5 may have the configuration of each of the plurality of page buffers PB1 to PBn illustrated in FIG. 1.

Referring to FIG. 5, the page buffer PB may include a plurality of latches Latch1 to Latch5 and a first switch SW1. In such a case, the page buffer PB is described by taking as an example including first to fifth latches Latch1 to Latch5 and the switch SW1, and the number of latches is not limited.

The first switch SW1 may electrically connect or disconnect a bit line BL and a common node Node_SO to/from each other based on a first page buffer selection signal PBSelA. The first switch SW1 may include a transistor TR. The transistor TR may receive the first page buffer selection signal PBSelA through a gate thereof, and the bit line BL and the common node Node_SO may be connected to both ends (drain and source) of the transistor TR, respectively.

Each of the first to fifth latches Latch1 to Latch5 may be connected to the common node Node_SO. In such a case, the first latch Latch1 may be placed closest to the bit line BL, and the fifth latch Latch5 may be placed farthest from the bit line BL. The second to fourth latches Latch2 to Latch4 may be placed between the first latch Latch1 and the fifth latch Latch5.

The first latch Latch1 may be a sensing latch. The first latch Latch1 may sense the voltage level of the bit line BL or the amount of current of the bit line BL, and store data according to the sensed value. Accordingly, the first latch Latch1 may be controlled to be activated during a read operation or a verification operation.

The fifth latch Latch5 may be a cache latch. The fifth latch Latch5 may receive data DATA from the outside of the page buffer PB and store the received data DATA during a program operation, or output the data DATA to the outside of the page buffer PB during a read operation. Accordingly, the fifth latch Latch5 may be controlled to be activated during the program operation or the read operation.

The second to fourth latches Latch2 to Latch4 may be data storage latches. The reason that the data storage latches are illustrated and described as three latches Latch2 to Latch4 in FIG. 5 is because a memory cell may store 3 bits (LSB, CSB, MSB) of data. Accordingly, the second to fourth latches Latch2 to Latch4 may each store 3 bits (LSB, CSB, MSB) of data transferred from the fifth latch Latch5 during a program operation. During a read operation, the second to fourth latches Latch2 to Latch4 may each store 3 bits (LSB, CSB, MSB) of data transmitted from the first latch Latch1. Accordingly, the second to fourth latches Latch2 to Latch4 may be controlled to be activated during a read operation or a program operation. The number of data storage latches may vary depending on the number of data bits that may be stored in a memory cell.

Figure 6:
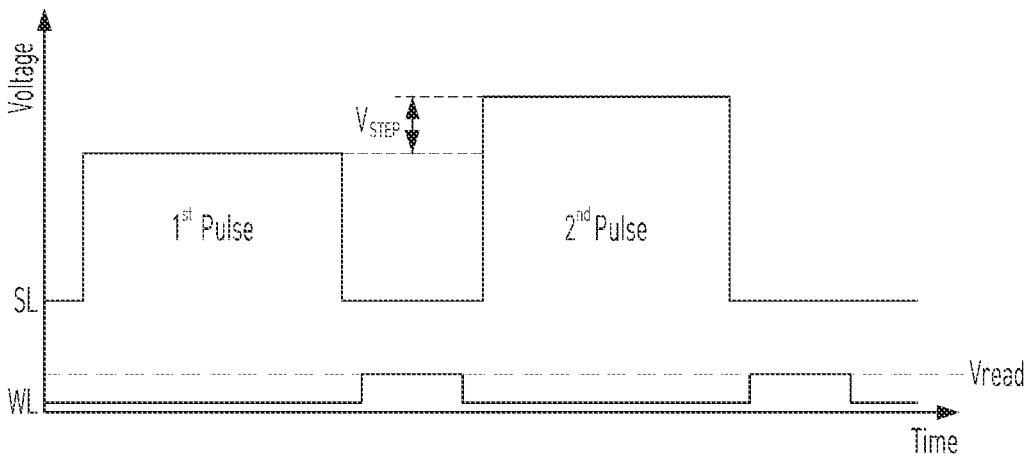
FIGS. 6 and 7 are diagrams for describing an operation of a semiconductor device in accordance with an embodiment of the present disclosure.
Figure 7:
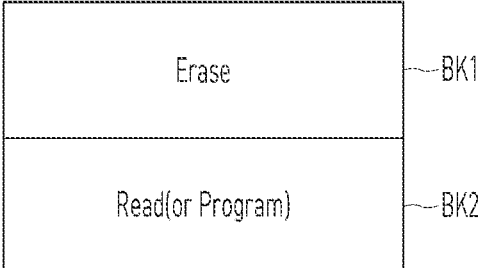

FIGS. 6 and 7 are diagrams for describing the operation of the semiconductor device in accordance with an embodiment of the present disclosure.

As illustrated in FIG. 6, the semiconductor device in accordance with an embodiment of the present disclosure may perform an erase operation by using an incremental step pulse erase (ISPE) method of gradually increasing the level of an erase voltage provided to the first source line SL1 or the second source line SL2 or the first and second source lines SL1 and SL2.

That is, each of the memory blocks BK1 and BK2 included in the semiconductor device in accordance with an embodiment of the present disclosure may perform an erase operation by using the ISPE method. With reference to FIG. 6, the erase operation of each of the memory blocks BK1 and BK2 according to the ISPE method is described. In such a case, in FIG. 6, the source lines SL1 and SL2 and the word lines WL1A to WLnA and WL1B to WLnB of each of the memory blocks BK1 and BK2 are illustrated as SL and WL for convenience of description, respectively.

Referring to FIG. 6, in a state in which the word lines WL are at a ground voltage level, a first erase pulse 1$^{st}$ Pulse having an erase voltage level may be provided to the source line SL, so that a first erase operation may be performed.

After the first erase operation is ended, a first erase verification operation may be performed by driving the source line SL to the ground voltage level and providing a read voltage Vread to the word line WL. In such a case, when the first erase operation is determined to be a failure Fail in the first erase verification operation, a second erase operation may be performed.

The second erase operation may be performed by driving the word lines WL to the ground voltage level again and providing a second erase pulse 2$^{nd}$ Pulse to the source line SL. In such a case, the voltage level of the second erase pulse 2$^{nd}$ Pulse may be a greater voltage level than the voltage level of the first erase pulse 1$^{st}$ Pulse. That is, the erase voltage provided to the source line SL during the second erase operation may be an erase voltage having a greater voltage level than the voltage level during the first erase operation by a preset voltage level VSTEP.

After the second erase operation is ended, a second erase verification operation may be performed by driving the source line SL to the ground voltage level and providing the read voltage Vread to the word line WL. In such a case, when the second erase operation is determined to be a success Pass in the second erase verification operation, the erase operation of the memory block may be ended.

When the second erase operation is determined to be a failure Fail again, a third erase operation may be performed, and the level of an erase voltage provided to the source line SL in the third erase operation may be greater than the erase voltage level in the second erase operation.

In this way, the semiconductor device in accordance with an embodiment of the present disclosure may perform an ISPE erase operation and provide a source voltage to an electrically disconnected source line, the voltage level of the source voltage gradually increasing. For example, each of the first and second source line driving circuits 510 and 520 illustrated in FIG. 1 may be configured to provide an erase voltage according to the ISPE method during an erase operation.

FIG. 7 illustrates that in the memory blocks BK1 and BK2 included in the semiconductor device in accordance with an embodiment of the present disclosure, some memory blocks BK1 are performing an erase operation Erase and the remaining memory blocks BK2 are performing a read operation Read or a program operation Program. In such a case, for convenience of description, the first memory block BK1 performs an erase operation and the second memory block BK2 performs a read operation.

With reference to FIGS. 3 and 4, the first memory block BK1 that performs an erase operation and the second memory block BK2 that performs a read or program operation are described.

An erase operation may be performed in a state in which the plurality of first memory strings St_1A to St_nA included in the first memory block BK1 are electrically disconnected from the plurality of bit lines BL1 to BLn, respectively. In such a case, the first source line SL1 may be driven to the level of the erase voltage by the first source line driving circuit 510.

A read or program operation may be performed in a state in which the plurality of second memory strings St_1B to St_nB included in the second memory block BK2 are electrically connected to the plurality of bit lines BL1 to BLn, respectively. In such a case, the second source line SL2 may be driven to the level of the ground voltage during the read operation and to the level of the external power supply voltage during the program operation by the second source line driving circuit 520.

When the first memory block BK1 performs the read or program operation and the second memory block BK2 performs the erase operation, the first memory block BK1 may be electrically connected to the plurality of bit lines BL1 to BLn, and the second memory block BK2 may be electrically disconnected from the plurality of bit lines BL1 to BLn as described above. The first source line SL1 may be driven to the ground voltage level or the level of the external power supply voltage by the first source line driving circuit 510, and the second source line SL2 may be driven to an erase voltage level by the second source line driving circuit 520.

Subsequently, when another memory block completes the read or program operation, the memory block having performed the erase operation may be electrically connected to the plurality of bit lines BL1 to BLn and perform a verification operation for the erase operation through the plurality of page buffers PB1 to PBn.

In this way, the semiconductor device in accordance with an embodiment of the present disclosure may be configured to include a source line for each of a plurality of memory blocks, and may control some of the plurality of memory blocks to perform an erase operation while other memory blocks perform a read or program operation. Accordingly, the semiconductor device in accordance with an embodiment of the present disclosure may perform an erase operation and other operations at the same time, thereby performing more operations required by a host than a general semiconductor device that performs the erase operation and other operations separately.

Although embodiments according to the technical idea of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure. Furthermore, the embodiments may be combined to form additional embodiments.

What is claimed is:

1. A semiconductor device comprising:
a memory array with NAND strings;
a first source line driving circuit that drives a first source line;
a second source line driving circuit that drives a second source line;
a first memory block including a plurality of first memory strings coupled between the first source line and a plurality of bit lines, respectively; and
a second memory block including a plurality of second memory strings coupled between the second source line and the plurality of bit lines, respectively,
wherein each of the first and second source line driving circuits drives the first and second source lines to different levels, respectively, so that one of the first and second memory blocks performs an erase operation while the other performs a read operation or program operation.

2. The semiconductor device of claim 1, wherein the first source line driving circuit and the second source line driving circuit drive the first source line and the second source line to mutually different voltage levels, respectively.

3. The semiconductor device of claim 2, wherein, when the read operation or the program operation is performed on the first memory block, the first source line driving circuit drives the first source line to a ground voltage level or a power supply voltage level, and
when the erase operation is performed on the first memory block, the first source line driving circuit drives the first source line to an erase voltage level greater than the ground voltage level.

4. The semiconductor device of claim 3, wherein, when the read operation or the program operation is performed on the second memory block, the second source line driving circuit drives the second source line to the ground voltage level or the power supply voltage level, and when the erase operation is performed on the second memory block, the second source line driving circuit drives the second source line to the erase voltage level.

5. The semiconductor device of claim 4, further comprising:
a plurality of page buffers coupled to the plurality of bit lines, respectively.

6. The semiconductor device of claim 5, wherein the plurality of page buffers are electrically coupled to a selected memory block of the first and second memory blocks through the plurality of bit lines, and perform the read operation or a verification operation for the program operation, and
wherein the selected memory block performs the read operation or the program operation.

7. The semiconductor device of claim 6, wherein the plurality of page buffers are electrically isolated from a particular memory block of the first and second memory blocks, and
wherein the particular memory block performs the erase operation.

8. The semiconductor device of claim 7, wherein, when the erase operation is completed, the plurality of page buffers are electrically coupled to the particular memory block having performed the erase operation, and perform a verification operation for the erase operation.

9. The semiconductor device of claim 1, wherein each of the plurality of first and second memory strings comprises:
a plurality of drain select transistors coupled to the plurality of bit lines, respectively;
a plurality of source select transistors coupled to the first source line; and
a plurality of memory cells coupled in series between each of the plurality of drain select transistors and each of the plurality of source select transistors.

10. The semiconductor device of claim 9, wherein the plurality of first and second memory strings are electrically coupled to or decoupled from the plurality of bit lines according to turn-on and turn-off of the plurality of drain select transistors, respectively.

11. The semiconductor device of claim 10, wherein the plurality of first and second memory strings are electrically coupled to or decoupled from the first and second sources lines according to turn-on and turn-off of the plurality of source select transistors, respectively.

12. An operation method of a semiconductor device having a memory array with NAND strings, the operation method comprising:
driving a first source line to a level of an erase voltage;
driving a second source line to a level of one of a ground voltage and a power supply voltage;
performing an erase operation on a first memory block coupled to the first source line; and
performing a read operation or a program operation on a second memory block coupled to the second source line while the first memory block performs the erase operation,
wherein the erase voltage, the ground voltage, and the power supply voltage have different levels from each other.

13. The operation method of claim 12, wherein performing the erase operation comprises:
electrically decoupling a plurality of first memory strings included in the first memory block from a plurality of bit lines; and
electrically coupling the first source line to the plurality of first memory strings.

14. The operation method of claim 13, wherein performing the erase operation further comprises:

driving, to a level of the ground voltage, a plurality of first word lines coupled to the plurality of first memory strings.

15. The operation method of claim 13, wherein performing the read operation or the program operation comprises:

electrically coupling a plurality of second memory strings included in the second memory block to the plurality of bit lines; and electrically coupling the second source line to the plurality of second memory strings during the read operation, and electrically decoupling the second source line from the plurality of second memory strings during the program operation.

16. A semiconductor device comprising:

a memory array with NAND strings;

a first source line;

a second source line;

a plurality of bit lines;

a first memory block including a plurality of first memory strings coupled between the first source line and the plurality of bit lines, respectively;

a second memory block including a plurality of second memory strings coupled between the second source line and the plurality of bit lines, respectively;

a control circuit configured to simultaneously perform an erase operation on the first memory block, and a read or program operation on the second memory block;

a first source line driving circuit configured to drive the first source line to an erase voltage; and a second source line driving circuit configured to drive the second source line to a ground voltage less than the erase voltage.

17. The semiconductor device of claim 16, further comprising:

a plurality of page buffers coupled to the plurality of bit lines, respectively.

18. The semiconductor device of claim 16, wherein each of the plurality of first and second memory strings comprises:

a plurality of drain select transistors coupled to the plurality of bit lines, respectively;

a plurality of source select transistors coupled to the first source line; and a plurality of memory cells coupled in series between each of the plurality of drain select transistors and each of the plurality of source select transistors.

19. The semiconductor device of claim 18, wherein the plurality of first and second memory strings are electrically coupled to or decoupled from the plurality of bit lines according to turn-on and turn-off of the plurality of drain select transistors, respectively.

20. The semiconductor device of claim 19, wherein the plurality of first and second memory strings are electrically coupled to or decoupled from the first and second sources lines according to turn-on and turn-off of the plurality of source select transistors, respectively.

* * * * *